United States Patent
Schrems et al.

(10) Patent No.: US 6,329,703 B1
(45) Date of Patent: *Dec. 11, 2001

(54) CONTACT BETWEEN A MONOCRYSTALLINE SILICON REGION AND A POLYCRYSTALLINE SILICON STRUCTURE AND METHOD FOR PRODUCING SUCH A CONTACT

(75) Inventors: Martin Schrems, Langenbrück; Kai Wurster; Klaus-Dieter Morhard, both of Dresden; Joachim Hoepfner, Planegg, all of (DE)

(73) Assignee: Infineon Technologies AG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/030,227

(22) Filed: Feb. 25, 1998

(51) Int. Cl.[7] .................. H01L 29/80; H01L 31/112; H01L 31/0288
(52) U.S. Cl. .............. 257/636; 257/296; 257/636; 438/476; 438/251; 438/660
(58) Field of Search .................. 257/296, 611, 257/636, 254; 438/476, 660

(56) References Cited

U.S. PATENT DOCUMENTS

| | | | |
|---|---|---|---|
| 4,012,762 | * 3/1977 | Abe et al. | 357/52 |
| 4,302,763 | 11/1981 | Ohuchi et al. | 257/49 |
| 4,433,469 | 2/1984 | Goodman | 438/164 |
| 4,608,096 | 8/1986 | Hill | 148/33 |
| 4,682,407 | * 7/1987 | Wilson et al. | 29/576 |
| 4,937,205 | 6/1990 | Nakayama et al. | 438/513 |
| 5,232,865 | 8/1993 | Manning et al. | 438/382 |
| 5,242,855 | * 9/1993 | Oguro | 438/660 |
| 5,354,381 | 10/1994 | Sheng | 118/723 |
| 5,360,758 | 11/1994 | Bronner et al. | 438/243 |
| 5,401,669 | * 3/1995 | Faiser et al. | 438/476 |
| 5,416,037 | * 5/1995 | Sato et al. | 438/254 |
| 5,565,370 | 10/1996 | Jerome et al. | 438/365 |

OTHER PUBLICATIONS

Erin C. Jones et al., Plasma Immersion Ion Implantation for Electronic Materials, Jpn. J. Appl. Phys. vol. 35 (1996) pp. 1027–1036, part 1, No. 2B, Feb. 1996.

E. Adler et al., "The evolution of IBM CMOS DRAM technology", vol. 39, No. 1/2–IBM CMOS Technology, 1995.

* cited by examiner

*Primary Examiner*—Wael Fahmy
*Assistant Examiner*—William M. Brewster
(74) *Attorney, Agent, or Firm*—Herbert L. Lerner; Laurence A. Greenberg; Werner A. Stemer

(57) ABSTRACT

A contact between a polycrystalline silicon structure and a monocrystalline silicon region is produced by doping the silicon structure in amorphous or polycrystalline form and/or doping the monocrystalline silicon region with a dopant, in particular with oxygen, in such a concentration that a solubility limit is exceeded. In a subsequent heat treatment, dopant precipitations are formed which either control grain growth in the polycrystalline silicon layer or prevent a propagation of crystal faults into a substrate in the monocrystalline silicon region. Such a contact can be used, in particular, as a buried strap in a DRAM trench cell.

11 Claims, 6 Drawing Sheets

CONTACT BETWEEN A MONOCRYSTALLINE SILICON REGION AND A POLYCRYSTALLINE SILICON STRUCTURE AND METHOD FOR PRODUCING SUCH A CONTACT

BACKGROUND OF THE INVENTION

Field of the Invention

The invention relates to a semiconductor configuration having a monocrystalline silicon region and a polycrystalline silicon structure adjacent thereto. The invention also relates to a method of producing such a semiconductor configuration.

In a production of integrated circuits, contacts frequently are needed between a monocrystalline silicon region and a polycrystalline silicon structure. The monocrystalline region is generally formed by the silicon semiconductor substrate itself, for example by a doped silicon region produced in the silicon substrate, such as is needed for MOS transistors or bipolar transistors. The polycrystalline silicon structure is an electrical connection for the monocrystalline silicon region and is produced either from a polycrystalline silicon layer or from an amorphous silicon layer which becomes polycrystalline in subsequent steps of the method.

A crystallization or a recrystallization of the amorphous or polycrystalline silicon structure occurs in subsequent thermal steps. In that process, it has to be borne in mind that an interface between the monocrystalline silicon region and the silicon structure generally is formed of a thin oxide or is otherwise contaminated or may be qualitatively inferior. That may result in uncontrolled (re)crystal-lization, i.e. in grain sizes which vary considerably spatially. The mechanical stress produced in that situation can be eliminated by crystal defect formation in the monocrystalline silicon, such as, for example, dislocation formation. Those crystal defects impair the electrical properties of the substrate, for example as a result of an increased leakage current, and there is therefore the risk of components or active structures disposed in the substrate (for example, transistors, trench capacitors, pn junctions) not having the predetermined electrical properties, but already exhibiting initial faults or, alternatively, medium-term and long-term quality losses.

A first example of such a contact is the bit-line contact in a DRAM memory, in which the memory cell type can be of any kind (for example, a so-called stacked cell or trench cell).

A further example of a semiconductor circuit having such a contact is a DRAM memory circuit in which each memory cell includes a trench capacitor and an associated selection transistor. In such a cell, a trench is etched into the silicon substrate and most of the trench wall is covered with a capacitor dielectric. DRAM memories are described in greater detail in an article by E. Adler et al. entitled "The Evolution of IBM CMOS DRAM Technology", IBM J. of Research and Development, 1995, Vol. 39, NO ½, IBM CMOS Technology. It is usual, but not absolutely necessary, to provide the upper part of the trench wall with a thicker insulation collar. The trench is filled with doped polycrystalline silicon which forms the memory electrode, with the second capacitor electrode being formed as a "buried plate" in a suitable manner by the substrate. The trench is disposed adjacently to the associated selection transistor, with the contact between the memory electrode and a doped region of the transistor being made either through a polysilicon structure at the surface of the substrate (so-called surface strap) or, if the trench is disposed immediately adjacent a doped region of the selection transistor to reduce the space requirement, at a point in the trench wall situated therebetween, in which case that point must not have any insulation. The contact to the doped region of the transistor is therefore a contact between monocrystalline silicon and polycrystalline silicon and may either be situated at the surface of the substrate or be a trench-wall contact. During subsequent thermal steps (for example, annealing processes, layer depositions), the problems explained above-may occur in that case and result in the failure of memory cells or in cells with reduced retention time. Particular difficulties are presented in that connection by cells having variable retention time (so-called VRT cells) in which the retention time changes abruptly with time. Such cells can therefore only be detected by electrical tests in some cases, which results in a subsequent failure during customer operation.

An example of a production method for such memory cells is described in U.S. Pat. No. 5,360,758. In that case, the cell-wall contact is produced through the use of a polysilicon layer ("buried strap") introduced into the upper region. Prior to the deposition of the buried strap, situated at an interface between the monocrystalline silicon and the buried strap is a thin silicon oxide layer which is produced by a wet-chemical cleaning or a thermal oxidation prior to the deposition of the amorphous or polycrystalline silicon for the buried strap. That oxide layer generally breaks up during subsequent thermal steps. In that connection, the thickness of the oxide layer, which is determined by its production process and a subsequent residence time in air, is important. If the oxide layer is thin, in particular <1 nm, it breaks up during subsequent thermal steps to form oxide spherules ($SiO_x$, where $x \approx 2$) at the interface. As a result, the contact resistance at the interface is reduced to such an extent that the capacitor, i.e. the memory electrode in the trench, can be charged sufficiently rapidly. The formation of the spherules, i.e. their size and mean spacing, is at the same time virtually uncontrollable. Uncontrolled (re)crystallization of the buried strap of silicon occurs between the oxide spherules. As explained, the mechanical stress produced in that process results in crystal defect formation, in particular dislocations, in the monocrystalline silicon. The oxide layer should therefore only break up after the high-temperature steps in the entire production method, in order to avoid dislocations.

If an unduly thick oxide layer is chosen, it does not break up at all. Although the formation of dislocations and other crystal faults is avoided, the electrical resistance with respect to the doped region of the selection resistor and to the capacitor is then so high that the memory electrode cannot or can no longer be adequately charged or discharged during the write/read cycles.

Under manufacturing conditions it has therefore not been possible to produce an oxide layer which breaks up precisely at the correct point in time at every point in a silicon wafer.

Summary of the Invention

It is accordingly an object of the invention to provide a contact between a monocrystalline silicon region and a polycrystalline silicon structure and a method for producing such a contact, which overcome the hereinafore-mentioned disadvantages of the heretofore-known devices and methods of this general type, in which the contact has low contact resistance and the occurrence or propagation of dislocations in the monocrystalline silicon is avoided and in particular, the contact is intended to be usable as bit-line contact in a memory cell and it is furthermore intended to be usable in a DRAM memory cell as a surface contact or a trench-wall contact between a trench filling and a doped region in the monocrystalline silicon substrate.

With the foregoing and other objects in view there is provided, in accordance with the invention, a semiconductor configuration, comprising an electrically conductive monocrystalline silicon region; and an electrically conductive polycrystalline silicon structure immediately adjacent the monocrystalline silicon region; the monocrystalline silicon region and/or the polycrystalline silicon structure containing dopant precipitations of an oxygen-containing dopant.

With the objects of the invention in view there is also provided a method for producing a contact between a polycrystalline silicon structure and a monocrystalline silicon region, which comprises producing a silicon structure in amorphous or polycrystalline form adjoining a monocrystalline silicon region; doping the silicon structure and/or the monocrystalline silicon region with an oxygen-containing dopant in a concentration exceeding a solubility limit of the dopant in the silicon structure or the silicon region; and performing a temperature treatment for forming dopant precipitations in the silicon structure or the silicon region and crystallizing the silicon structure.

The invention uses a doping of the non-monocrystalline silicon structure and/or of the monocrystalline silicon region with a dopant from the group including oxygen, oxygen/nitrogen mixtures, oxygen/nitrogen compounds and other oxygen-containing mixtures or compounds, with the concentration of the dopant being chosen in such a way that the solubility limit of the dopant is exceeded (the dopants mentioned may also be referred to as oxygen-containing dopants for short). As a result, dopant precipitations form in the monocrystalline region or in the non-monocrystalline silicon structure during subsequent thermal steps. If the silicon structure is doped, the precipitations permit grain growth in the silicon structure only to a certain size. That grain size is determined by the density (i.e. the mean spacing) of the dopant precipitations. The dopant precipitations therefore virtually have a cage-like action. The higher the density of the dopant precipitations, the smaller the maximum and the mean polysilicon grain size in the silicon structure. The mean number (i.e. the density) of the dopant precipitations is controlled by the dopant supersaturation (dopant concentration divided by the solubility concentration) and the thermal budget (ramp rates, holding temperatures) during the subsequent thermal treatments. During doping of the monocrystalline silicon region, dopant precipitations are produced there which act as a barrier against the propagation of dislocations.

The semiconductor configuration according to the invention, which includes a monocrystalline silicon region and a polycrystalline silicon structure, is characterized by dopant precipitations in the polycrystalline silicon structure or in the monocrystalline silicon, with a mean and a maximum grain size of the polysilicon being determined in the first case by the density of the dopant precipitations. In this connection, the monocrystalline silicon region and the polysilicon can be disposed one above the other so that a horizontal contact is produced, or in any other orientation, for example next to one another (vertical contact).

The invention avoids the uncontrolled (re)crystallization in the silicon structure and the crystal defect formation in the monocrystalline silicon or limits the propagation of crystal defects in the monocrystalline silicon. At the same time, a low contact resistance is achieved between the polycrystalline silicon structure and the monocrystalline silicon region.

Oxygen, in particular, is suitable as dopant since precipitations are particularly readily formed because of the low solubility of the oxygen. High doping is therefore unnecessary. The conductivity of the silicon structure or of the silicon region is not reduced decisively. Oxygen precipitations are then present as $SiO_x$, where $x \approx 2$.

In particular, ion implantation, plasma doping or plasma immersion ion implantation (PIII) can be used as a doping method. These methods are familiar to the person skilled in the art and are explained in greater detail, for example, in U.S. Pat. Nos. 4,937,205 and 5,354,381, as well as in Jap. J. Appl. Phys., Vol. 35 (1996), pages 1027–1036. The dosage can be controlled particularly well in the case of plasma doping. On one hand, the doping can be carried out in such a way that the dopant is uniformly distributed in the silicon structure, i.e. an essentially identical dopant concentration is present everywhere and is above the solubility limit. On the other hand, a dopant maximum can be produced in a predetermined part of the silicon region or of the silicon structure, for example in the vicinity of the contact or at a predetermined depth. Furthermore, a contact-near region of the monocrystalline silicon can also be doped instead of, or in addition to, the silicon structure. Dopant precipitations are then produced in the monocrystalline silicon in the vicinity of the contact and these act as a barrier to the propagation of dislocations from the polycrystalline silicon.

The silicon structure can also be doped in situ by adding, for example, $O_2$, NO, $N_2O$, $H_2O$ during the deposition of polycrystalline or amorphous silicon. For this purpose, a method according to the known in-situ doping can be used. A further suitable doping method is described in U.S. Pat. No. 5,354,710.

The concentration of the dopant in the silicon is in the range from $10^{17}$ to $10^{20}$ cm$^{-3}$, and preferably in the range from $10^{18}$ to $10^{19}$ cm$^{-3}$.

Further details of the production of the polycrystalline silicon structure are described in co-pending U.S. Pat. application Ser. No. 09/030,406, entitled "Method For Producing a Polycrystalline Silicon Structure and a Polycrystalline Silicon Layer to be Produced by the Method" having the same inventors and the same filing date as the instant application, the total disclosure of which is incorporated herein.

Other features which are considered as characteristic for the invention are set forth in the appended claims.

Although the invention is illustrated and described herein as embodied in a contact between a monocrystalline silicon region and a polycrystalline silicon structure and a method for producing such a contact, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
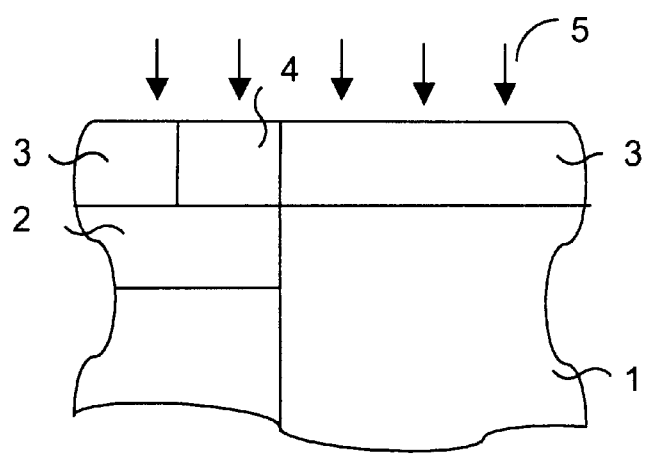
FIGS. 1 and 2 are fragmentary, diagrammatic, cross-sectional views through a semiconductor substrate having a monocrystalline silicon region at which a first exemplary embodiment of the invention is illustrated.

Referring now to the figures of the drawings in detail and first, particularly, to FIG. 1 thereof, there is seen a silicon substrate 1 which has a doped monocrystalline region 2 at its surface. The doped monocrystalline region 2 may, for example, be a source region of an MOS transistor. A silicon structure 4 which is disposed on the doped monocrystalline region 2 is not monocrystalline but is polycrystalline, for example, and has been produced by a deposition process. Other regions of the configuration are provided with an insulation 3. According to the invention, this polysilicon structure 4 is doped with an oxygen-containing dopant 5, for example oxygen. The doping can be carried out, for example, by a vertical ion implantation. The implantation can be performed over the entire surface if that is compatible with the remaining semiconductor circuit. In this connection, the implantation parameters are chosen in such a way that the dopant concentration achieved in the polysilicon structure 4 exceeds the solubility limit. For example, in the case of a 100–200 nm thick polysilicon layer 4, a dosage of $3-5 \times 10^{13}$ cm$^{-2}$ is chosen at an energy of 3–5 keV.

Figure 2:
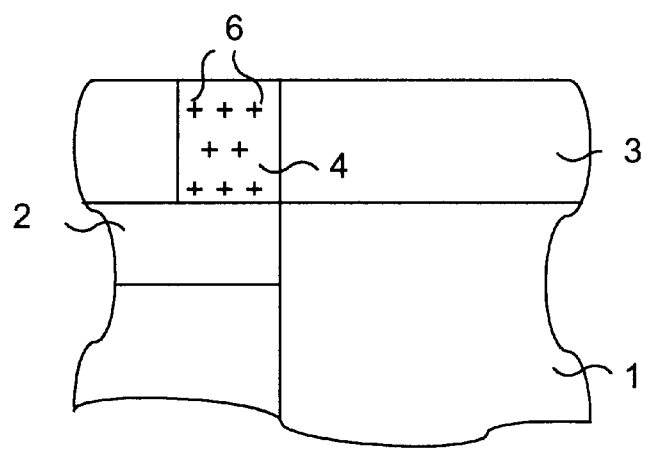

FIG. 2 shows that a temperature step is subsequently carried out, for example for 30 min at 900–1000° C., as a result of which dopant precipitations 6, in this case SiO$_x$ precipitations (x≈approximately 2) are formed in the polysilicon structure 4. As explained above, these limit the grain growth in the polysilicon and consequently prevent the propagation of crystal faults into the doped region 2 and into the substrate 1 (FIG. 2).

Figure 3:
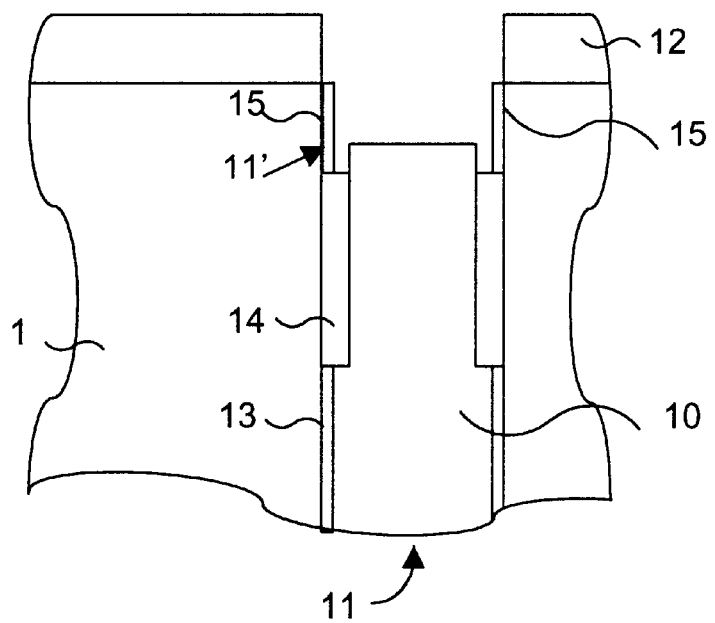
FIGS. 3 to 11 are fragmentary, cross-sectional views through a semiconductor substrate during the production of a DRAM for the purpose of explaining second through fifth exemplary embodiments of the method according to the invention, wherein FIG. 3 serves as a starting point for the second through fifth exemplary embodiments.

FIG. 3 illustrates a starting point for the further exemplary embodiments which is a semiconductor substrate having a partly finished DRAM memory cell. In this connection, only the structures and steps of the method which are essential to the invention are explained. The silicon substrate 1 has a trench 11 for receiving a memory electrode 10. The trench has been produced by known methods using a trench etching mask 12. A lower region of a trench wall (including a trench floor) is provided with a capacitor dielectric 13 and an upper region is lined with a thicker oxide collar 14. The trench is filled with doped polysilicon 10 and the polysilicon is etched back in this case under the substrate surface to produce a buried strap. The oxide collar is removed at a position 11' in the upper trench wall and, to be specific, at an upper edge of the trench, in order to permit a connection to a doped region which is to be formed in the substrate and is part of a selection transistor. In the present example, the entire upper edge of the trench is exposed. A preliminary cleaning, for example BHF, is performed which results in an oxide layer 15 at the exposed trench wall 11'. In this case about 0.3 to 0.7 nm of silicon monoxide is formed. Further details of a suitable production method are described in U.S. Pat. No. 5,360,758, in particular column 1, line 58 to column 4, line 49. This structure (possibly with further steps in the method which are not essential to the invention) serves as starting point for the further examples of contact production.

Figure 4:
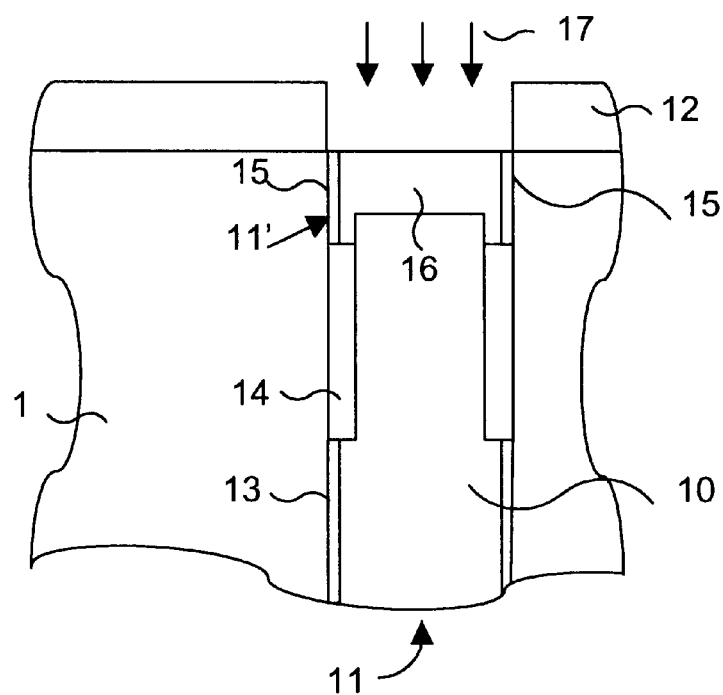
Figure 5:
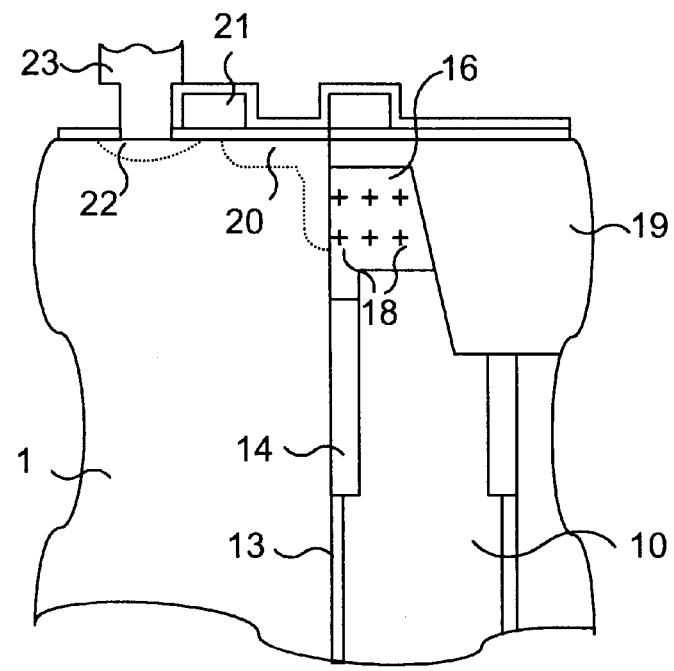

As is shown in FIGS. 4 and 5, a silicon structure 16 is produced by depositing a 300 nm thick undoped amorphous silicon layer at approximately 550° C. with subsequent back-etching so that a buried strap 16 which is thus produced is situated completely within the trench. Preferably, an upper edge of the buried strap 16 is situated below the substrate surface, for example by about 50 nm. The back-etching can be performed with a chemical dry etching method or by reactive ion etching. Polycrystalline silicon may also be deposited instead of amorphous silicon, in which case the processing temperature is typically 600 to 650° C. The doping with oxygen is carried out through the use of vertical ion implantation 17 (dosage of 3 to $5 \times 10^{13}$ cm$^{-2}$, energy of 3 to 5 keV) or oxygen plasma doping (time of 10 seconds, energy of 1 keV). A uniform distribution of oxygen precipitations 18 is achieved in the buried strap. A subsequent completion of the memory cell is performed by known methods (see, for example, the above-mentioned U.S. patent). In particular, in order to insulate adjacent memory cells from one another, so-called shallow-trench insulation regions 19 are produced by etching a recess which overlaps a part of the trench wall. It is etched at least down to the oxide collar 14 and then filled with the insulation 19. As a result, no contact is any longer present in this region between the buried strap 16 and the substrate. A selection transistor 24, 20, 21, 22 (gate oxide, source, gate, drain) is produced in which one doped region 20 adjoining the trench wall 11' is situated opposite the insulation region 19 so that the contact with the memory electrode is made in this case. Another doped region 22 is contacted by a bit line 23.

Figure 6:
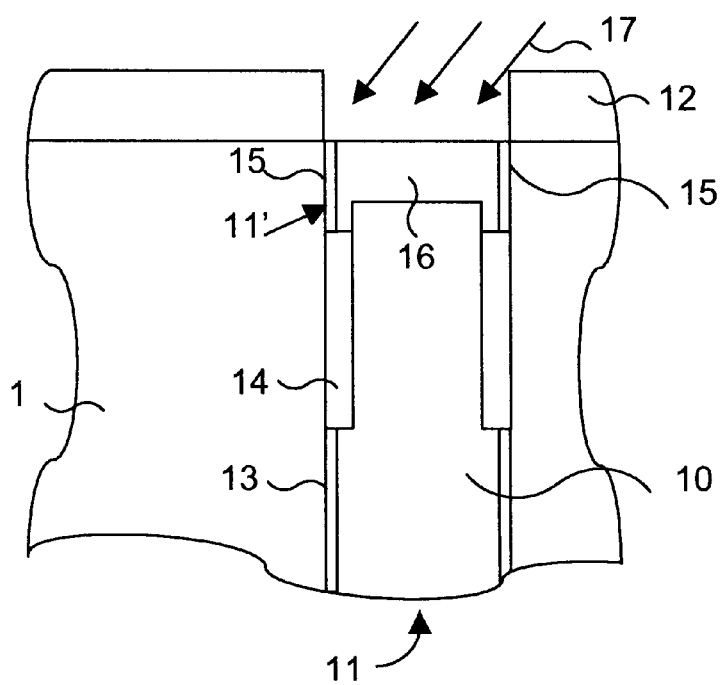
Figure 7:
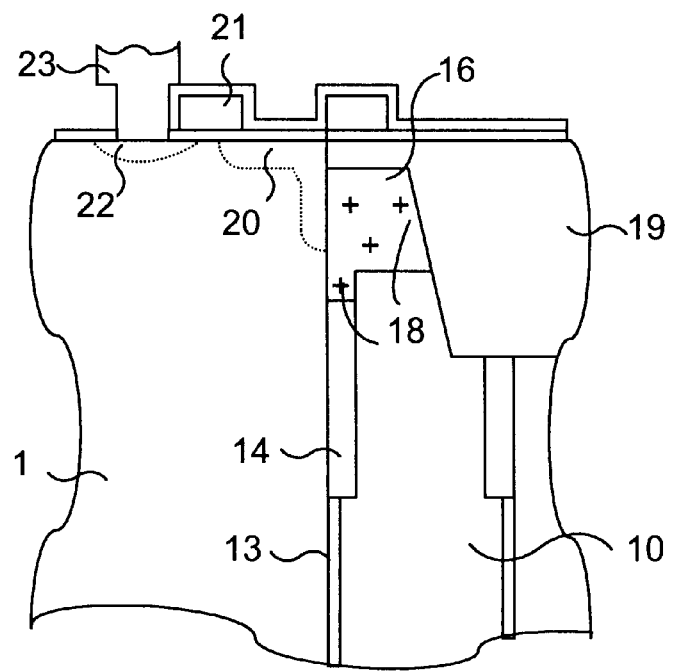

FIGS. 6 and 7 show a third exemplary embodiment that differs from the second in an inclined implantation of the dopant, whereas remaining steps in the method can be carried out identically. Depending on the spatial configuration of the structures, the implantation angle is 20° to 40°, in particular about 30°, the dosage is 3 to $5 \times 10^{13}$ cm$^{-2}$ and the energy is about 15 to 20 keV. The maximum in the dopant distribution is consequently achieved in the vicinity of the interface between the monocrystalline silicon and the buried strap. The density of the dopant precipitations 18 is therefore greater in this case and the grain growth can be particularly well controlled at this point.

Figure 8:
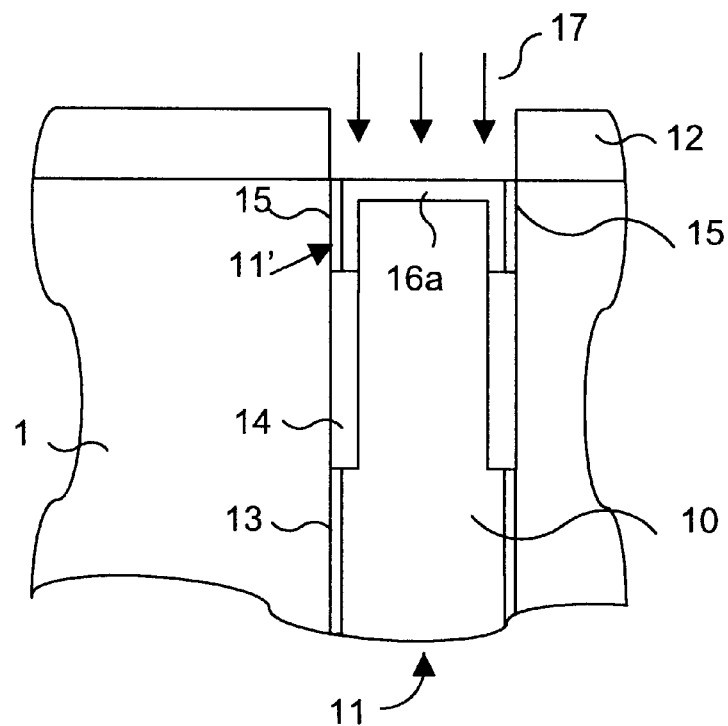
Figure 9:
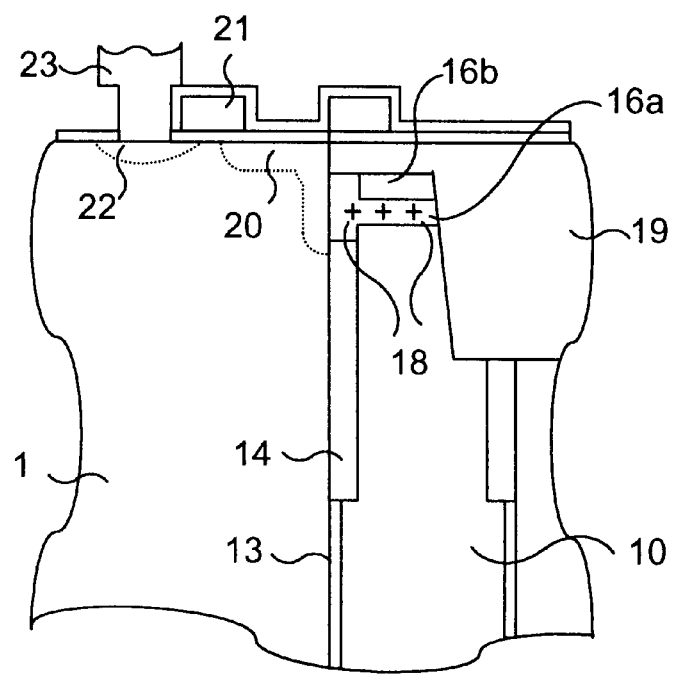

FIGS. 8 and 9 disclose a fourth example in which a thin, for example approximately 10 nm thick, undoped amorphous silicon layer 16a is first deposited after the preliminary cleaning at about 500 to 550° C. That layer is doped through the use of plasma doping or vertical ion implantation, in which the parameters can be chosen as in the second example. Amorphous or polycrystalline silicon 16b is then deposited in the necessary residual thickness, in this case therefore 290 nm, and back-etched as before so that the buried strap 16a, 16b is formed. The memory cell is completed as described above. In this example, the concentration maximum is placed at a depth, and a uniform distribution of dopant precipitations 18 is achieved in a thin silicon layer 16a.

Figure 10:
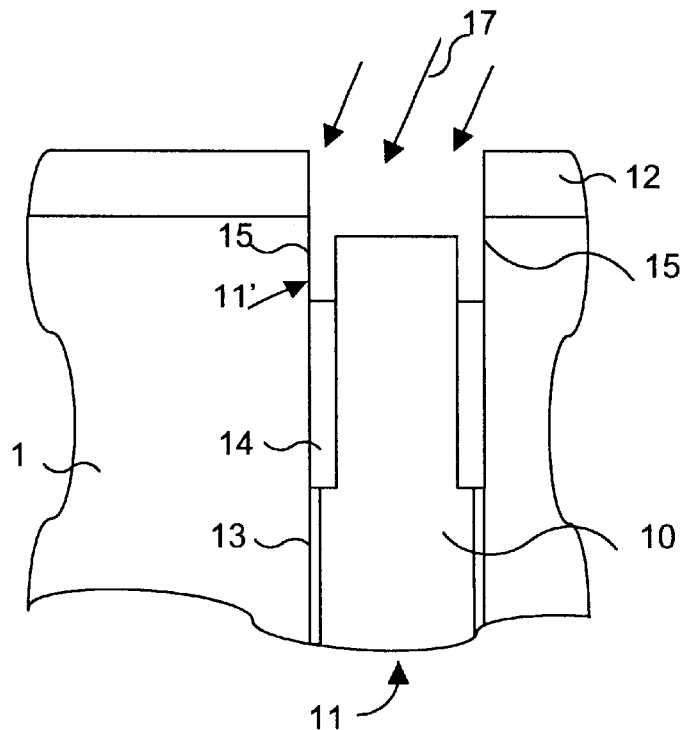
Figure 11:
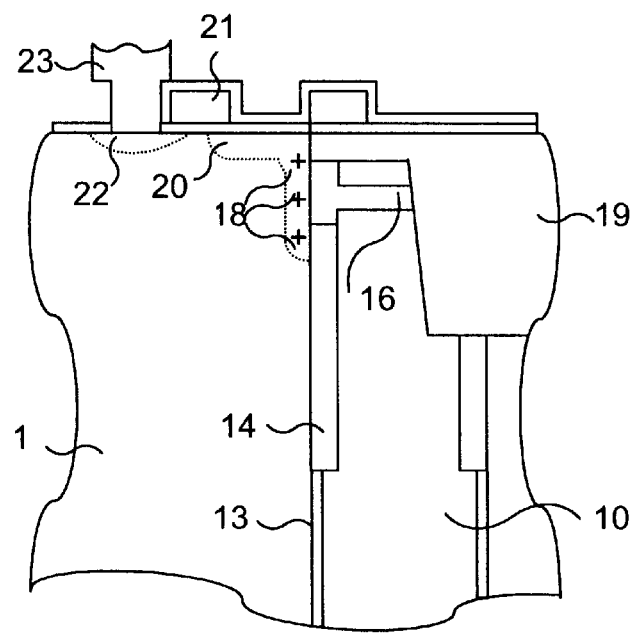

In a fifth example shown in FIGS. 10 and 11, the dopant precipitations 18 are not produced in the silicon structure (buried strap), but instead in the monocrystalline silicon as a barrier to the propagation of dislocations. For this purpose, the doping is performed after the preliminary cleaning, which produces a thin oxide layer 15 on the trench wall 11'. A plasma doping or a vertical implantation can be performed with the parameters specified above. Preferably, however, an inclined implantation (for example 30°, 5 keV, 3 to $5 \times 10^{13}$ cm$^{-2}$) is used since implantation is then carried out in a controlled manner in the monocrystalline silicon at the free upper trench wall 11'. After doping, amorphous or polycrystalline silicon which is about 300 nm thick is deposited and back-etched to the buried strap 16, and the subsequent method is also performed as in the previous examples.

The second through fifth exemplary embodiments have been described by reference to the memory cell disclosed in U.S. Pat. No. 5,360,758, in which adjacent trenches are insulated by an STI trough after producing the buried strap. The invention may, however, also be used in other memory cells and production methods. For example, a trench capacitor can be connected to the transistor through a surface strap or a so-called stacked capacitor can be connected to the selection transistor.

Figure 12:
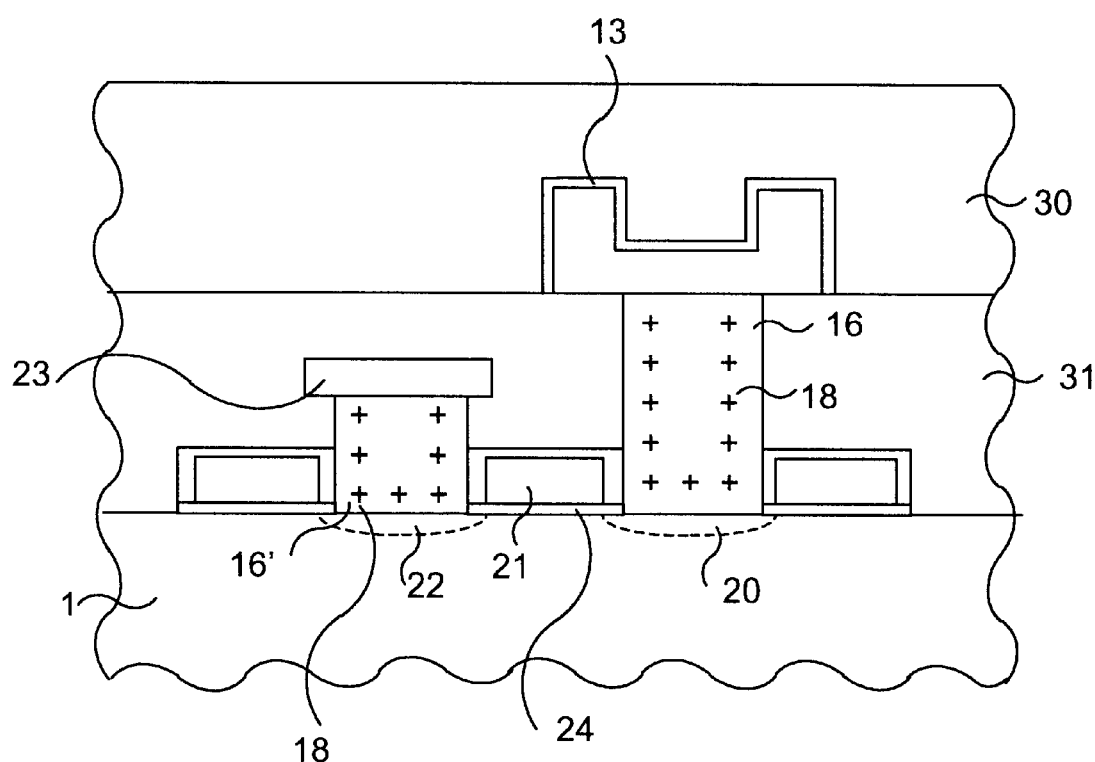
FIG. 12 is a fragmentary, cross-sectional view through a semiconductor substrate with a DRAM stacked capacitor cell produced according to the invention.

FIG. 12 shows a DRAM cell with a stacked capacitor disposed above the transistor and the bit line 23. In this configuration, both the bit line 23 and the capacitor 10, 13, 30 are connected through a polysilicon structure 16' or 16 produced according to the invention. The same reference symbols are used for structures corresponding electrically to those in the previous examples, except that the second capacitor electrode is indicated by reference numeral 30 and an insulation layer is indicated by reference numeral 31. The polysilicon structures 16', 16 contain dopant precipitations 18 having a density which is a maximum in the vicinity of the doped regions 20, 22 and the surrounding insulation 31. This is achieved by an initial addition of the oxygen-containing dopant during the CVD deposition.

The fourth exemplary embodiment is also particularly well suited for making a horizontal contact to a doped region in the silicon substrate, for example a bit-line contact. A thin polysilicon layer is therefore first deposited, the latter is doped and then the remaining layer thickness is deposited. In this manner, dopant precipitations are produced in a controlled manner in the vicinity of the horizontal interface and the grain growth is well controlled at this point.

We claim:

1. A semiconductor configuration, comprising:

an electrically conductive monocrystalline silicon region; and an electrically conductive polycrystalline silicon structure immediately adjacent said monocrystalline silicon region, said polycrystalline silicon structure is sufficiently electrically conductive as to be used as an electrical connection, said polycrystalline silicon structure containing dopant precipitations of an oxygen-containing dopant in a concentration of $10^{17}$ to $10^{20}$ cm$^{-3}$ permitting grain growth in the polycrystalline silicon structure only to a size determined by said concentration of said dopant precipitations.

2. The semiconductor configuration according to claim 1, wherein said monocrystalline silicon region is one of a source region and a drain region of a MOS transistor.

3. The semiconductor configuration according to claim 1, wherein said polycrystalline silicon structure is one of a capacitor electrode and a connection of a capacitor electrode.

4. The semiconductor configuration according to claim 1, wherein said monocrystalline silicon region is formed at a surface of a semiconductor substrate and said polycrystalline silicon structure adjoins said monocrystalline silicon region horizontally or vertically.

5. The semiconductor configuration according to claim 1, wherein said polycrystalline silicon region is a buried strap having a uniform distribution of said oxygen-containing dopant.

6. The semiconductor configuration according to claim 5, wherein said density of said dopant precipitations is approximately constant in all of said polycrystalline silicon structure.

7. The semiconductor configuration according to claim 5, wherein said density of said dopant precipitations has a maximum in a vicinity of said monocrystalline silicon region.

8. The semiconductor configuration according to claim 5, wherein said density of said dopant precipitations has a maximum at a predetermined depth.

9. The semiconductor configuration according to claim 1, wherein said monocrystalline silicon region contains said dopant precipitations and said density of said dopant precipitations has a maximum in the vicinity of said polycrystalline silicon structure.

10. The semiconductor configuration according to claim 1, wherein said polycrystalline silicon structure contains dopant precipitations of an oxygen-containing dopant in a concentration of $10^{18}$ to $10^{20}$ cm$^{-3}$.

11. The semiconductor configuration according to claim 1, comprising an electric contact between said monocrystalline silicon region and said polycrystalline silicon structure, said electrical contact having a low contact resistance.

* * * * *